US010382038B2

(12) United States Patent
Korolev et al.

(10) Patent No.: US 10,382,038 B2
(45) Date of Patent: Aug. 13, 2019

(54) SYSTEM AND METHOD OF ACCELERATION OF SLOW SIGNAL PROPAGATION PATHS IN A LOGIC CIRCUIT

(71) Applicant: NXP USA, Inc., Austin, TX (US)

(72) Inventors: Vasily Vladimirovich Korolev, Moscow (RU); Victor Mikhailovich Mikhailov, Moscow (RU); Mikhail Yurievich Semenov, Moscow (RU)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/975,998

(22) Filed: May 10, 2018

(65) Prior Publication Data

US 2019/0140644 A1 May 9, 2019

(30) Foreign Application Priority Data

Nov. 9, 2017 (RU) ................................ 2017138987

(51) Int. Cl.
*H03K 19/017* (2006.01)
*H03K 19/0185* (2006.01)

(52) U.S. Cl.
CPC ....... *H03K 19/017* (2013.01); *H03K 19/0185* (2013.01)

(58) Field of Classification Search
None
See application file for complete search history.

(56) References Cited

U.S. PATENT DOCUMENTS

| 5,889,416 | A | 3/1999 | Lovett |
| 6,097,222 | A | 8/2000 | Lovett |
| 6,462,597 | B2 * | 10/2002 | Lee .......................... H03K 5/133 326/85 |
| 7,948,268 | B2 | 5/2011 | Rosen et al. |
| 8,169,348 | B2 | 5/2012 | Tsunoda |
| 9,893,726 | B1 * | 2/2018 | Katakwar .......... H03K 19/0013 |
| 2010/0183108 | A1 | 7/2010 | Shin |
| 2011/0273940 | A1 * | 11/2011 | Tanzawa ................ G11C 16/08 365/189.11 |
| 2014/0043174 | A1 | 2/2014 | Suzuki |
| 2017/0111047 | A1 * | 4/2017 | Mai ................ H03K 19/018521 |

* cited by examiner

*Primary Examiner* — Minh D A
*Assistant Examiner* — James H Cho

(57) ABSTRACT

An electronic device includes a logic circuit, a pullup acceleration circuit, a first signal propagation path, and a second signal propagation path. The first signal propagation path propagates a logic value transition from an input terminal of the logic circuit to an output terminal of the logic circuit through the input terminal, two inverters of the logic circuit, a switch of the logic circuit, and the output terminal within a first amount of time based on a transition at the first input terminal. The second signal propagation path propagates the logic value transition from the input terminal to the output terminal through one inverter of the logic circuit and the pullup acceleration circuit within a second amount of time. The second amount of time is shorter than the first amount of time in response to the logic circuit being non-monotonic with respect to the logic value.

19 Claims, 5 Drawing Sheets

SYSTEM AND METHOD OF ACCELERATION OF SLOW SIGNAL PROPAGATION PATHS IN A LOGIC CIRCUIT

CROSS-REFERENCE TO RELATED APPLICATION(S)

The present application claims priority to Russian Patent Application No. 2017138987, entitled "SYSTEM AND METHOD OF ACCELERATION OF SLOW SIGNAL PROPAGATION PATHS IN A LOGIC CIRCUIT" filed on Nov. 9, 2017, the entirety of which is herein incorporated by reference.

FIELD OF THE DISCLOSURE

This disclosure relates generally to signal paths in a logic circuit, and more particularly, to accelerating slow signal paths in the logic circuit.

BACKGROUND

Some electronic devices are utilized for high speed applications, such a double data rate transmission logic. For circuits in high speed applications a balance of switching time for output value switches, or transitions, can be desirable. Logic circuits can be monotonic with respect to all input variables, can be non-monotonic with respect to all the input variables, or can be monotonic with respect to some of the input variables and non-monotonic with respect to other input variables. In digital logic circuits, a circuit is referred to as "monotonic increasing" with respect to an input variable if the output value of the logic circuit is always greater than or equal to the output value of the logic circuit when the input variable is equal to one as compared to the output value of the logic circuit when the input variable is zero. A circuit is monotonic decreasing with respect to an input variable if the output value of the logic circuit is always less than or equal to the output value of the logic circuit when the input variable is equal to one as compared to the output value of the logic circuit when the input variable is zero. However, if neither of the above conditions is true for an input variable, then the logic circuit is non-monotonic with respect to that input variable. For monotonic functions of the logic circuit, signal path delays can be balanced by transistor sizing within certain signal paths. However, for non-monotonic functions, signal path delays cannot be balanced by transistor sizing, but instead transistor sizing causes the balance to decrease. Therefore, a circuit design is needed to balance signal path delays for non-monotonic functions of a logic circuit.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

FIGS. 1-4 illustrate an electronic device including a logic circuit, a pullup acceleration circuit, and a pulldown acceleration circuit. The logic circuit can be monotonic with respect to all input values provided on the input terminals of the logic circuit, can be non-monotonic with respect to all input values, or can be monotonic with respect to some of the input values and non-monotonic with respect to other input values. When the logic circuit is non-monotonic with respect to one or more of the input values, the speed that value transitions propagate through the logic circuit can vary. Thus, a determination can be made as to the input value or values that the logic circuit is non-monotonic. A determination can also be made as to the logic value of the other input values that result in the slowest propagation of the logic value transitions through the logic circuit.

A transistor within the pullup circuit can be coupled to either the input logic value or an inverted input logic value that is at a low logic value when the non-monotonic input value transition causes the output logic value transition from zero to one. In an embodiment, the coupling of the transistor in the pullup circuit can decrease the amount of time that it takes for the output value to transition from 0→1. Similarly, a transistor within the pulldown circuit can be coupled to either the input logic value or an inverted input logic value that is at a high logic value when the non-monotonic input value transition causes the output logic value transition from 1→0. In an embodiment, the coupling of the transistor in the pulldown circuit can decrease the amount of time that it takes for the output value to transition from 1→0 as will be described below.

Figure 1:
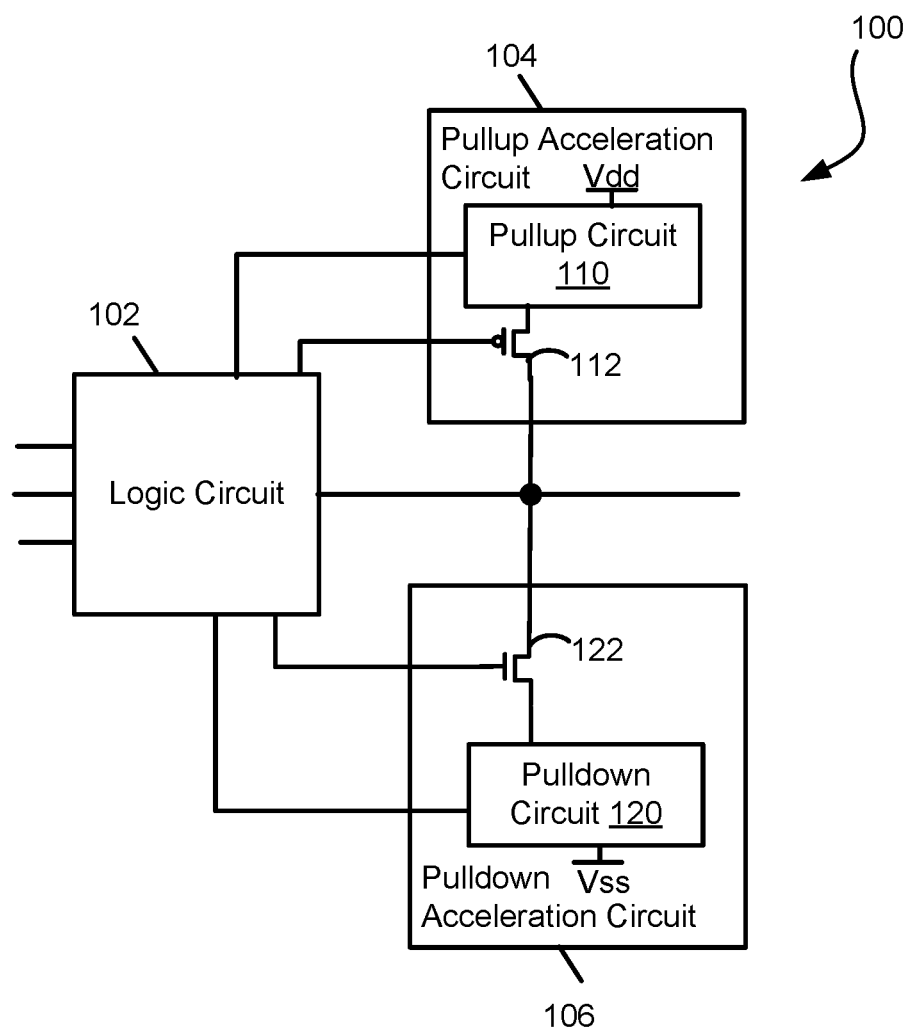
FIG. 1 illustrates a block diagram of an electronic device according to at least one embodiment of the present disclosure.

FIG. 1 illustrates a block diagram of an electronic device 100 according to at least one embodiment of the present disclosure. The electronic device 100 includes a logic circuit 102, a pullup acceleration circuit 104, and a pulldown acceleration circuit 106. In an embodiment, the pullup acceleration circuit 104 includes pullup circuitry 110 and a pullup control transistor 112. In an embodiment, the pulldown acceleration circuit 106 includes pulldown circuitry 120 and a pulldown control transistor 122.

The logic circuit 102 includes multiple inputs terminals, such as first, second and third input terminals, and multiple output terminals, such as first, second, third, fourth, and fifth output terminals. In different embodiments, the logic circuit 102 can include more input terminals and more output terminals without varying from the scope of this disclosure. The third output terminal of the logic circuit 102 provides an output signal from the logic circuit 102.

The pullup acceleration circuit 104 includes a first input terminal coupled to the first output terminal of the logic circuit 102, a second input terminal coupled to the second output terminal of the logic circuit 102, and an output terminal coupled to the third output terminal of the logic circuit 102. The pulldown acceleration circuit 106 includes a first input terminal coupled to the fourth output terminal of the logic circuit 102, a second input terminal coupled to the fifth output terminal of the logic circuit 102, and an output terminal coupled to the third output terminal of the logic circuit 102.

The pullup circuit 110 includes a first terminal coupled to the first input terminal of the pullup acceleration circuit 104, a second terminal coupled to a first supply voltage, Vdd, and a third terminal. The pullup control transistor 112 includes a first current electrode coupled to the third terminal of the pullup circuit 110, a second current electrode coupled to the output terminal of the pullup acceleration circuit 104, and a control electrode coupled to the second input terminal of the pullup acceleration circuit 104. While a particular configuration of the pullup acceleration circuit 104 is described herein with the pullup circuit 110 being connected between the supply voltage, Vdd, and the pullup control transistor 112, one of ordinary skill in the art would recognize that the pullup circuit 110 and the pullup control transistor 112 can be switched, such that the pullup control transistor is connected to the supply voltage, Vdd, and the pullup circuit 110 is connected to the output terminal.

The pulldown circuit 120 includes a second terminal coupled to the first input terminal of the pulldown acceleration circuit 106, a second terminal coupled to a second supply voltage, Vss, and a third terminal. The pulldown control transistor 122 includes a first current electrode coupled to the third terminal of the pulldown circuit 120, a second current electrode coupled to the output terminal of the pulldown acceleration circuit 106, and a control electrode coupled to the first input terminal of the pulldown acceleration circuit 106. While a particular configuration of the pulldown acceleration circuit 106 is described herein with the pulldown circuit 120 being connected between the supply voltage, Vss, and the pulldown control transistor 122, one of ordinary skill in the art would recognize that the pulldown circuit 120 and the pulldown control transistor 122 can be switched, such that the pullup control transistor is connected to the supply voltage, Vss, and the pulldown circuit 120 is connected to the output terminal.

During operation the logic circuit 102 can be monotonic with respect to all input values provided on the input terminals of the logic circuit 102, can be non-monotonic with respect to all input values, or can be monotonic with respect to some of the input values and non-monotonic with respect to other input values. When the logic circuit 102 is non-monotonic with respect to one or more of the input values, the speed that value transitions propagate through the logic circuit 102 can vary. Thus, a determination can be made as to the input value or values that the logic circuit 102 is non-monotonic. A determination can also be made as to the logic value of the other input values that result in the slowest propagation of the logic value transitions through the logic circuit.

A transistor within the pullup circuit 110 can be coupled to either the input logic value or an inverted input logic value that is at a low logic value when the non-monotonic input value transition causes the output logic value transition from zero to one. In an embodiment, the coupling of the transistor in the pullup circuit 110 can decrease the amount of time that it takes for the output value to transition from 0→1. Similarly, a transistor within the pulldown circuit 120 can be coupled to either the input logic value or an inverted input logic value that is at a high logic value when the non-monotonic input value transition causes the output logic value transition from 1→0. In an embodiment, the coupling of the transistor in the pulldown circuit 120 can decrease the amount of time that it takes for the output value to transition from 1→0 as will be described below.

Figure 2:
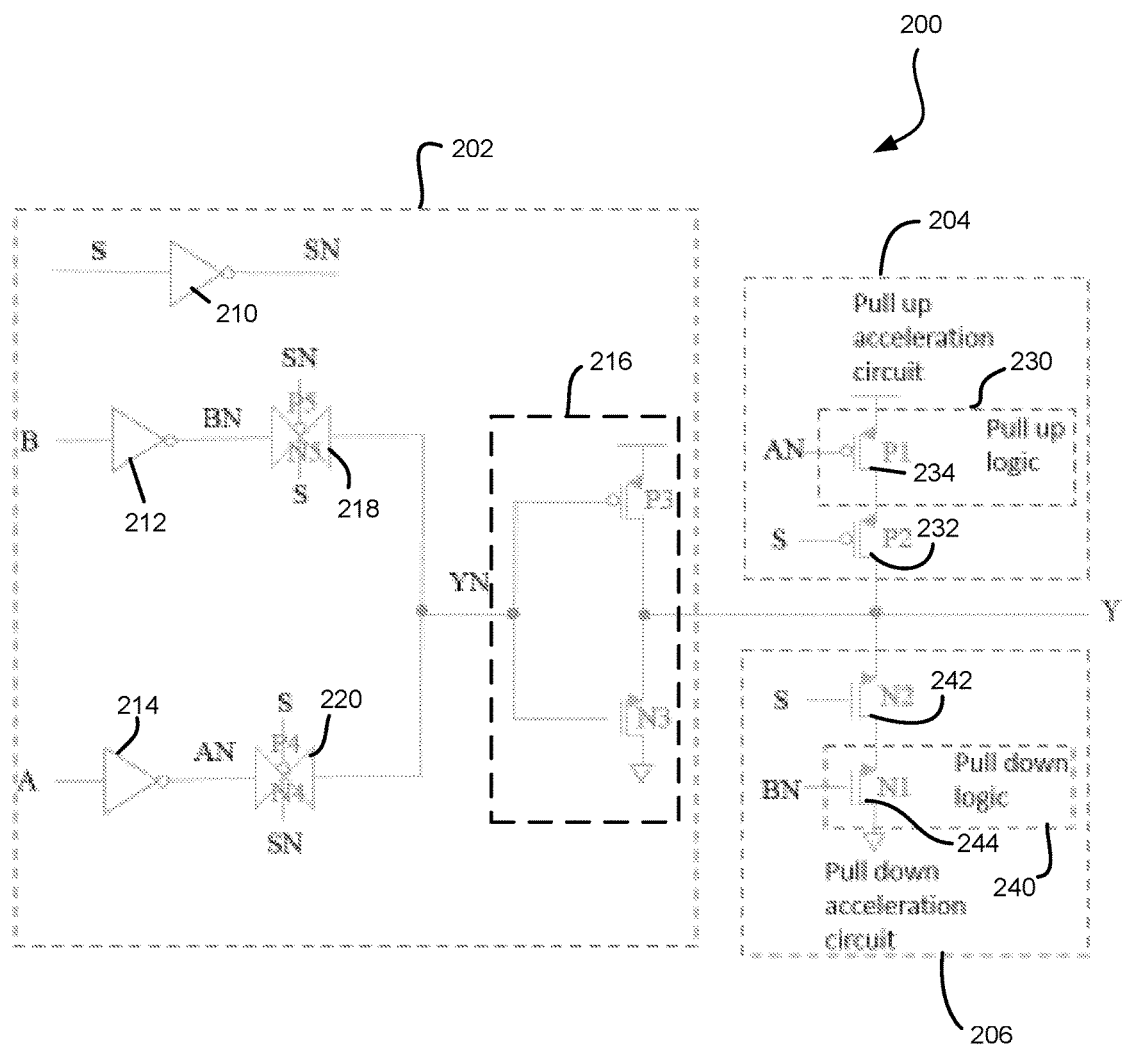
FIG. 2 illustrates a schematic diagram of an embodiment of the electronic device according to at least one embodiment of the present disclosure.

FIG. 2 illustrates a schematic diagram of an embodiment of an electronic device 200 according to at least one embodiment of the present disclosure. In an embodiment, the electronic device 200 can be an embodiment of the electronic device 100 of FIG. 1. The electronic device 200 includes a logic circuit 202, a pullup acceleration circuit 204, and a pulldown acceleration circuit 206. In an embodiment, the logic circuit 202 can be an embodiment of the logic circuit 102 of FIG. 1, the pullup acceleration circuit 204 can be an embodiment of the pullup acceleration circuit 104 of FIG. 1, and the pulldown acceleration circuit 206 can be an embodiment of the pulldown acceleration circuit 106 of FIG. 1.

The logic circuit 202 includes a first input terminal to receive a logic value, S, a second input terminal to receive a logic value, B, and a third input terminal to receive a logic value, A. In an embodiment, the logic circuit 202 can be an implementation of a 2:1 multiplexor. The logic circuit 202 also includes inverters 210, 212, 214, and 216, and pass gates 218 and 220. The inverter 210 includes a first terminal coupled to the first input terminal of the logic circuit 202, and a second terminal to provide an inverted logic value, SN. The inverter 212 includes a first terminal coupled to the second input terminal of the logic circuit 202, and a second terminal to provide an inverted logic value, BN. The inverter 214 includes a first terminal coupled to the third input terminal of the logic circuit 202, and a second terminal to provide an inverted logic value, AN. The inverter 216 includes a first terminal to receive an inverted output logic value, YN, and a second terminal to provide an output logic value, Y.

The pass gate 218 includes a first terminal coupled to the second terminal of the inverter 212, a second terminal coupled to the first terminal of the inventor 216, a first control terminal coupled to the second terminal of the inverter 210, and a second control terminal coupled to the first terminal of the inverter 210. In an embodiment, the first control terminal of the pass gate 218 is an inverted control terminal. The pass gate 220 includes a first terminal coupled to the second terminal of the inverter 214, a second terminal coupled to the first terminal of the inventor 216, a first control terminal coupled to the first terminal of the inverter 210, and a second control terminal coupled to the second terminal of the inverter 210. In an embodiment, the first control terminal of the pass gate 220 is an inverted control terminal. In an embodiment, the pass gates 218 and 220 can be any type of switch that provides a logic value from an input terminal to an output terminal in response to a particular control signal.

The pullup acceleration circuit 204 includes pullup logic 230 and a pullup control transistor 232. The pullup logic 230 includes a transistor 234. In an embodiment, the transistors 232 and 234 of the pullup acceleration circuit 204 can both be PMOS transistors. The pulldown acceleration circuit 206 includes pulldown logic 240 and a pulldown control transistor 242. The pulldown logic 240 includes a transistor 244. In an embodiment, the transistors 242 and 244 of the pulldown acceleration circuit 206 can both be NMOS transistors.

The transistor 234 of the pullup logic 230 includes a first current electrode coupled to a first supply voltage, Vdd, a second current electrode, and a control electrode coupled to the second terminal of the inverter 214. The pullup control transistor 232 includes a first current electrode coupled to the second current electrode of the transistor 234, a second current electrode coupled to the second terminal of the inverter 216, and a control electrode coupled to the first terminal of the inverter 210. The transistor 244 of the pulldown logic 240 includes a first current electrode coupled to a second supply voltage, Vss, a second current electrode, and a control electrode coupled to the second terminal of the inverter 212. The pulldown control transistor 242 includes a first current electrode coupled to the second current electrode of the transistor 244, a second current electrode coupled to the second terminal of the inverter 216, and a control electrode coupled to the first terminal of the inverter 210.

During operation of the electronic device 200, the logic value on each of the first, second, and third input terminals of the logic circuit 202 control the logic value on the second terminal of the inverter 216. For example, the input logic values S, A, and B, with the corresponding output logic value, Y, for the electronic device 200 can be seen in table 1 below:

TABLE 1

Truth Table for electronic device 200

| S | A | B | Y |
|---|---|---|---|
| 0 | 0 | 0 | 0 |
| 0 | 0 | 1 | 0 |
| 0 | 1 | 0 | 1 |
| 0 | 1 | 1 | 1 |
| 1 | 0 | 0 | 0 |
| 1 | 0 | 1 | 1 |
| 1 | 1 | 0 | 0 |
| 1 | 1 | 1 | 1 |

Thus, the output logic value can be represented as the following function:

$$Y = SN*A | S*B \qquad \text{EQ. 1}$$

The function for the output logic value Y can be monotonic with respect to input logic values A and B, such that F(A=1) is always greater than or equal to F(A=0), and F(B=1) is always greater than or equal to F(B=0). However, the function for the output logic value Y is non-monotonic with respect to input logic values S, such that F(A=1) is not always greater than or equal to F(S=0), as shown in Table 1 above.

Therefore, the path of a logic value transition through the logic circuit 202 can vary in speeds for different logic value transitions. In the example, of FIG. 2 the slowest transition paths through the electronic circuit 200 can be for S (1→0) and Y (0→1) with input states of A=1(AN=0), and S (0→1) and Y (1→0) with input states of B=0(BN=1). Thus, in previous logic circuits, the state change propagation through the logic circuit when the logic value transition is from S=1 to S=0 (which causes output logic value Y to transition from Y=0 to Y=1) is the slowest when input logic value A=1. Thus, the select input logic value, S, transitioning from 1→0 can cause the inverted logic value, SN, to transition from 0→1. Therefore, the pass gate 218 is turned off, and pass gate 220 is turned on, such that the inverted input logic value, AN=0, is provided at to the first terminal of inverter 216, which in turn cause the output logic state, Y, of the logic circuit 202 to transition from 0→1. Similarly, in previous logic circuits, the state change propagation through the logic circuit when the logic value transition is from S=0 to S=1 (which causes output logic value Y to transition from Y=1 to Y=0) is the slowest when input logic value B=0. Thus, the select input logic value, S, transitioning from 0→1 can cause the inverted logic value, SN, to transition from 1→0. Therefore, the pass gate 220 is turned off, and pass gate 218 is turned on, such that the inverted input logic value, BN=1, is provided at to the first terminal of inverter 216, which in turn cause the output logic state, Y, of the logic circuit 202 to transition from 1→0.

In this embodiment of electronic device 200, control electrode of the transistor 234 of pullup logic 230 is coupled to the second input terminal of the inverter 214 to receive the inverted input logic value, AN, and the transistor 244 of pullup logic 240 is coupled to the second input terminal of the inverter 212 to receive the inverted input logic value, BN.

In this embodiment, the logic value of AN=0 being provided to the control electrode of transistor 234 can increase the speed that the pullup acceleration circuit 204 causes the output logic value Y to transition from 0→1 when the input logic value S transitions from 1→0 and input value A=1. Thus, the reception of the inverted logic state, AN, at the control electrode of transistor 234 can increase the logic state transition propagation through the electronic device 200 when the input logic value S transitions from 1→0 and input value A=1.

Similarly, in this embodiment, the logic value of BN=1 being provided to the control electrode of transistor 244 can increase the speed that the pulldown acceleration circuit 206 causes the output logic value Y to transition from 1→0 when the input logic value S transitions from 0→1 and input value B=0. Thus, the reception of the inverted logic state, BN, at the control electrode of transistor 244 can increase the logic state transition propagation through the electronic device 200 when the input logic value S transitions from 0→1 and input value B=0.

Figure 3:
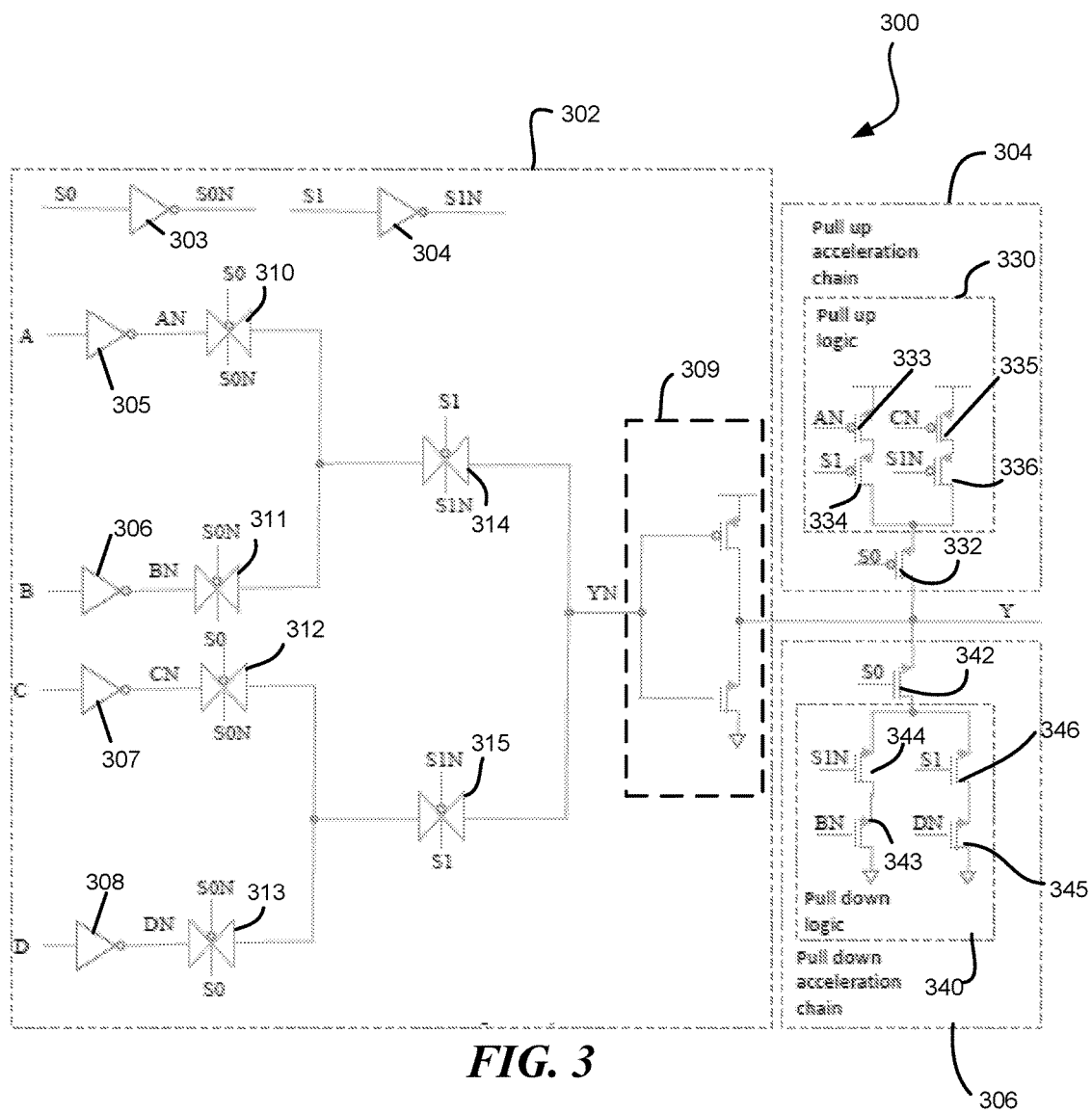
FIG. 3 illustrates a schematic diagram of another embodiment of the electronic device according to at least one embodiment of the present disclosure.

FIG. 3 illustrates a schematic diagram of another embodiment of the electronic device 300 according to at least one embodiment of the present disclosure. In an embodiment, the electronic device 300 can be an embodiment of the electronic device 100 of FIG. 1. The electronic device 300 includes a logic circuit 302, a pullup acceleration circuit 304, and a pulldown acceleration circuit 306. In an embodiment, the logic circuit 302 can be an embodiment of the logic circuit 102 of FIG. 1, the pullup acceleration circuit 304 can be an embodiment of the pullup acceleration circuit 104 of FIG. 1, and the pulldown acceleration circuit 306 can be an embodiment of the pulldown acceleration circuit 106 of FIG. 1.

The logic circuit 302 includes a first input terminal to receive a logic value, S0, a second input terminal to receive a logic value, S1, a third input terminal to receive a logic value, A, a fourth input terminal to receive a logic value, B, a fifth input terminal to receive a logic value, C, and a sixth input terminal to receive a logic value, D. In an embodiment, the logic circuit 302 can be an implementation of a 4:1 multiplexor. The logic circuit 302 also includes inverters 303, 304, 305, 306, 307, 308, and 309, and pass gates 310, 311, 312, 313, 314, and 315. The inverter 303 includes a first terminal coupled to the first input terminal of the logic circuit 302, and a second terminal to provide an inverted logic value, S0N. The inverter 304 includes a first terminal coupled to the second input terminal of the logic circuit 302, and a second terminal to provide an inverted logic value, S1N. The inverter 305 includes a first terminal coupled to the third input terminal of the logic circuit 302, and a second terminal to provide an inverted logic value, AN. The inverter 306 includes a first terminal coupled to the fourth input terminal of the logic circuit 302, and a second terminal to provide an inverted logic value, BN. The inverter 307 includes a first terminal coupled to the fifth input terminal of the logic circuit 302, and a second terminal to provide an inverted logic value, CN. The inverter 308 includes a first terminal coupled to the sixth input terminal of the logic circuit 302, and a second terminal to provide an inverted logic value, DN. The inverter 309 includes a first terminal to receive an inverted output logic value, YN, and a second terminal to provide an output logic value, Y.

The pass gate 310 includes a first terminal coupled to the second terminal of the inverter 305, a second terminal, a first control terminal coupled to the first terminal of the inverter 303, and a second control terminal coupled to the second terminal of the inverter 303. In an embodiment, the first control terminal of the pass gate 310 is an inverted control terminal. The pass gate 311 includes a first terminal coupled to the second terminal of the inverter 306, a second terminal, a first control terminal coupled to the second terminal of the inverter 303, and a second control terminal coupled to the first terminal of the inverter 303. In an embodiment, the first control terminal of the pass gate 311 is an inverted control terminal.

The pass gate 312 includes a first terminal coupled to the second terminal of the inverter 307, a second terminal, a first control terminal coupled to the first terminal of the inverter 303, and a second control terminal coupled to the second terminal of the inverter 303. In an embodiment, the first control terminal of the pass gate 312 is an inverted control terminal. The pass gate 313 includes a first terminal coupled to the second terminal of the inverter 308, a second terminal, a first control terminal coupled to the second terminal of the inverter 303, and a second control terminal coupled to the first terminal of the inverter 303. In an embodiment, the first control terminal of the pass gate 313 is an inverted control terminal.

The pass gate 314 includes a first terminal coupled to second terminals of pass gates 310 and 311, a second terminal coupled to the first terminal of the inverter 309, a first control terminal coupled to the first terminal of the inverter 304, and a second control terminal coupled to the second terminal of the inverter 304. In an embodiment, the first control terminal of the pass gate 314 is an inverted control terminal. The pass gate 315 includes a first terminal coupled to second terminals of pass gates 312 and 313, a second terminal coupled to the first terminal of the inverter 309, a first control terminal coupled to the second terminal of the inverter 304, and a second control terminal coupled to the first terminal of the inverter 304. In an embodiment, the first control terminal of the pass gate 315 is an inverted control terminal.

The pullup acceleration circuit 304 includes pullup logic 330 and a pullup control transistor 332. The pullup logic 330 includes transistors 333, 334, 335, and 336. In an embodiment, the transistors 332, 333, 334, 335, and 336 of the pullup acceleration circuit 304 can all be PMOS transistors. The pulldown acceleration circuit 306 includes pulldown logic 340 and a pulldown control transistor 342. The pulldown logic 340 includes transistors 343, 344, 345, and 346. In an embodiment, the transistors 342, 343, 344, 345, and 346 of the pulldown acceleration circuit 306 can both be NMOS transistors.

The transistor 333 includes a first current electrode coupled to a first supply voltage, Vdd, a second current electrode, and a control electrode coupled to the second terminal of the inverter 305. The transistor 334 includes a first current electrode coupled to the second current electrode of transistor 333, a second current electrode, and a control electrode coupled to the first terminal of the inverter 304. The transistor 335 includes a first current electrode coupled to the first supply voltage, Vdd, a second current electrode, and a control electrode coupled to the second terminal of the inverter 307. The transistor 336 includes a first current electrode coupled to the second current electrode of transistor 335, a second current electrode, and a control electrode coupled to the second terminal of the inverter 304. The pullup control transistor 332 includes a first current electrode coupled to the second current electrode of the transistor 334 and the second current electrode of the transistor 336, a second current electrode coupled to the second terminal of the inverter 309, and a control electrode coupled to the first terminal of the inverter 303.

The transistor 343 of the pulldown logic 340 includes a first current electrode coupled to a second supply voltage, Vss, a second current electrode, and a control electrode coupled to the second terminal of the inverter 306. The transistor 344 of the pulldown logic 340 includes a first current electrode coupled to the second current electrode of transistor 343, a second current electrode, and a control electrode coupled to the second terminal of the inverter 304. The transistor 345 of the pulldown logic 340 includes a first current electrode coupled to the second supply voltage, Vss, a second current electrode, and a control electrode coupled to the second terminal of the inverter 308. The transistor 346 of the pulldown logic 340 includes a first current electrode coupled to the second current electrode of transistor 345, a second current electrode, and a control electrode coupled to the first terminal of the inverter 304. The pulldown control transistor 342 includes a first current electrode coupled to the second current electrode of the transistor 344 and to the second current electrode of the transistor 346, a second current electrode coupled to the second terminal of the inverter 309, and a control electrode coupled to the first terminal of the inverter 303.

During operation of the electronic device 300, the logic value on each of the first, second, third, fourth, fifth, and sixth input terminals of the logic circuit 302 control the output logic value, Y, on the second terminal of the inverter 309. For example, the input logic values S, S1, A, B, C, and D with the corresponding output logic value, Y, for the electronic device 300 can be seen in table 1 below:

TABLE 2

Truth Table for electronic device 300

| S0 | A | B | C | D | S1 | Y |
|---|---|---|---|---|---|---|
| 0→1 | 0 | 1 | — | — | 0 | 0→1 |
| 1→0 | 0 | 1 | — | — | 0 | 1→0 |
| 0→1 | 1 | 0 | — | — | 0 | 1→0 |
| 1→0 | 1 | 0 | — | — | 0 | 0→1 |
| 0→1 | — | — | 0 | 1 | 1 | 0→1 |
| 1→0 | — | — | 0 | 1 | 1 | 1→0 |
| 0→1 | — | — | 1 | 0 | 1 | 1→0 |
| 1→0 | — | — | 1 | 0 | 1 | 0→1 |

The function for the output logic value Y can be monotonic with respect to input logic values A, B, C, and D. However, the function for the output logic value Y is non-monotonic with respect to input logic values S0 and S1.

Therefore, the path of a logic value transition through the logic circuit 302 can vary in speeds for different logic value transitions. In the example, of FIG. 3 the slowest transition paths through the electronic circuit 300 can be for S0 (1→0) and Y (0→1) with input states of S1=0 and A=1(AN=0), for S0 (1→0) and Y (0→1) with input states of S1=1(S1N=0) and C=1(CN=0), for S0 (0→1) and Y (1→0) with input states of S1=0(S1N=1) and B=0(BN=1), and for S0 (0→1) and Y (1→0) with input states of S1=1 and D=0(DN=1).

Thus, in previous logic circuits, the state change propagation through the logic circuit when the logic value transition is from S0=1 to S0=0 (which causes output logic value Y to transition from Y=0 to Y=1) is the slowest when input logic values A=1 and S1=0. Thus, the select input logic value, S0, transitioning from 1→0 can cause the inverted logic value, S0N, to transition from 0→1. Therefore, the pass gates 311 and 313 are turned off, and pass gates 310 and 312 are turned on, such that the inverted input logic value, AN=0, is provided to the first terminal of pass gate 314, and the inverted input logic value CN=0 is provided to the first terminal of pass gate 315. If the input logic value S1=0 and S1N=1, pass gate 315 is off and pass gate 314 is on, which in turn causes logic state at the first input terminal of the inverter 309 to be AN=0. The inverter 309 then provides an output logic value, Y, of Y=1. However, if the input logic value S1=1 and S1N=0, pass gate 314 is off and pass gate 315 is on, which in turn causes logic state at the first input terminal of the inverter 309 to be CN=0. The inverter 309 then provides an output logic value, Y, of Y=1.

Similarly, in previous logic circuits, the state change propagation through the logic circuit when the logic value transition is from S0=0 to S0=1 (which causes output logic value Y to transition from Y=1 to Y=0) is the slowest when input logic values S1=0(S1N=1) and B=0(BN=1), and for S1=1 and D=0(DN=1). Thus, the select input logic value, S0, transitioning from 0→1 can cause the inverted logic value, S0N, to transition from 1→0. Therefore, the pass gates 310 and 312 are turned off, and pass gates 311 and 313 are turned on, such that the inverted input logic value, BN=0, is provided to the first terminal of pass gate 314, and the inverted input logic value DN=0 is provided to the first terminal of pass gate 315. If the input logic value S1=0 and S1N=1, pass gate 315 is off and pass gate 314 is on, which in turn causes logic state at the first input terminal of the inverter 309 to be BN=1. The inverter 309 then provides an output logic value, Y, of Y=0. However, if the input logic value S1=1 and S1N=0, pass gate 314 is off and pass gate 315 is on, which in turn causes logic state at the first input terminal of the inverter 309 to be DN=1. The inverter 309 then provides an output logic value, Y, of Y=0.

In this embodiment of electronic device 300, control electrode of the transistor 333 of pullup logic 330 is coupled to the second terminal of the inverter 305 to receive the inverted input logic value, AN, control electrode of the transistor 334 of pullup logic 330 is coupled to the first terminal of the inverter 304 to receive the input logic value, S1, control electrode of the transistor 335 of pullup logic 330 is coupled to the second terminal of the inverter 307 to receive the inverted input logic value, CN, and control electrode of the transistor 336 of pullup logic 330 is coupled to the second terminal of the inverter 304 to receive the inverted input logic value, S1N.

Similarly, control electrode of the transistor 343 of pullup logic 340 is coupled to the second terminal of the inverter 306 to receive the inverted input logic value, BN, control electrode of the transistor 344 of pullup logic 340 is coupled to the second terminal of the inverter 304 to receive the inverted input logic value, S1N, control electrode of the transistor 345 of pullup logic 340 is coupled to the first terminal of the inverter 308 to receive the inverted input logic value, DN, and control electrode of the transistor 346 of pullup logic 340 is coupled to the first terminal of the inverter 304 to receive the input logic value, S1.

In this embodiment, the logic value of AN=0 being provided to the control electrode of transistor 333, logic value of S1=0 being provided to the control electrode of transistor 334, the logic value of CN=0 being provided to the control electrode of transistor 335, and the logic value of S1N=0 being provided to the control electrode of transistor 336 can increase the speed that the pullup acceleration circuit 304 causes the output logic value Y to transition from 0→1 when the input logic value S0 transitions from 1→0 with input values A=1 and C=1. Thus, the reception of the inverted logic state, AN or CN, at the control electrode of transistor 333 or 335 can increase the logic state transition propagation through the electronic device 300 when the input logic value S0 transitions from 1→0 and input values of A=1 and C=1.

Similarly, in this embodiment, the logic value of BN=1 being provided to the control electrode of transistor 343, logic value of S1N=1 being provided to the control electrode of transistor 344, the logic value of DN=1 being provided to the control electrode of transistor 345, and the logic value of S1=1 being provided to the control electrode of transistor 346 can increase the speed that the pulldown acceleration circuit 306 causes the output logic value Y to transition from 1→0 when the input logic value S0 transitions from 0→1 with input values B=0 and D=0. Thus, the reception of the inverted logic state, BN or DN, at the control electrode of transistor 343 or 345 can increase the logic state transition propagation through the electronic device 300 when the input logic value S0 transitions from 0→1 and input values of B=0 and D=0.

Figure 4:
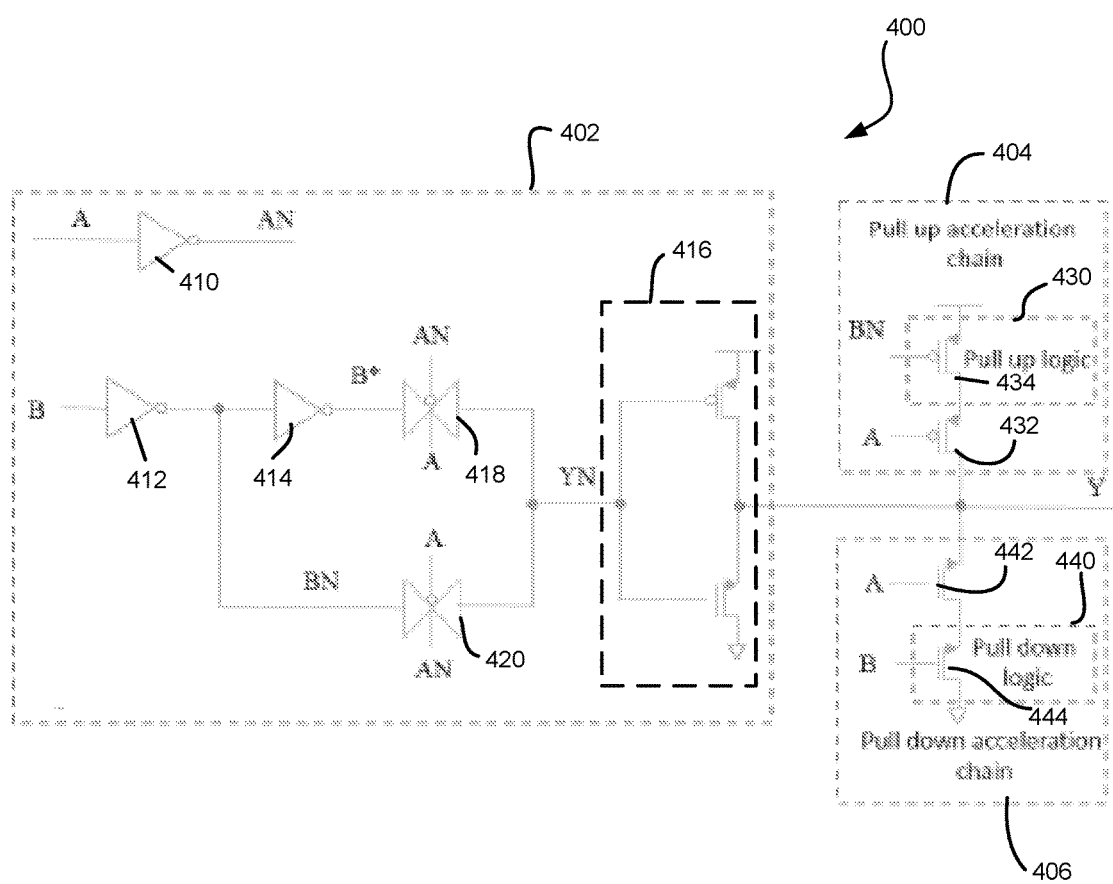
FIG. 4 illustrates a schematic diagram of another embodiment of the electronic device according to at least one embodiment of the present disclosure.

FIG. 4 illustrates a schematic diagram of another embodiment of the electronic device 400 according to at least one embodiment of the present disclosure. In an embodiment, the electronic device 400 can be an embodiment of the electronic device 100 of FIG. 1. The electronic device 400 includes a logic circuit 402, a pullup acceleration circuit 404, and a pulldown acceleration circuit 406. In an embodiment, the logic circuit 402 can be an embodiment of the logic circuit 102 of FIG. 1, the pullup acceleration circuit 404 can be an embodiment of the pullup acceleration circuit 104 of FIG. 1, and the pulldown acceleration circuit 406 can be an embodiment of the pulldown acceleration circuit 106 of FIG. 1.

The logic circuit 402 includes a first input terminal to receive a logic value, A, and a second input terminal to receive a logic value, B. In an embodiment, the logic circuit 402 can be an implementation of an XOR gate. The logic circuit 402 also includes inverters 410, 412, 414, and 416, and pass gates 418 and 420. The inverter 410 includes a first terminal coupled to the first input terminal of the logic circuit 402, and a second terminal to provide an inverted logic value, AN. The inverter 412 includes a first terminal coupled to the second input terminal of the logic circuit 402, and a second terminal to provide an inverted logic value, BN. The inverter 414 includes a first terminal coupled to the second terminal of the inverter 412, and a second terminal to provide the logic value, B. The inverter 416 includes a first terminal to receive an inverted output logic value, YN, and a second terminal to provide an output logic value, Y.

The pass gate 418 includes a first terminal coupled to the second terminal of the inverter 414, a second terminal coupled to the first terminal of the inventor 416, a first control terminal coupled to the second terminal of the inverter 410, and a second control terminal coupled to the first terminal of the inverter 410. In an embodiment, the first control terminal of the pass gate 418 is an inverted control terminal. The pass gate 420 includes a first terminal coupled to the second terminal of the inverter 412, a second terminal coupled to the first terminal of the inventor 416, a first control terminal coupled to the first terminal of the inverter 410, and a second control terminal coupled to the second terminal of the inverter 410. In an embodiment, the first control terminal of the pass gate 420 is an inverted control terminal.

The pullup acceleration circuit 404 includes pullup logic 430 and a pullup control transistor 432. The pullup logic 430 includes a transistor 434. In an embodiment, the transistors 432 and 434 of the pullup acceleration circuit 404 can both be PMOS transistors. The pulldown acceleration circuit 406 includes pulldown logic 440 and a pulldown control transistor 442. The pulldown logic 440 includes a transistor 444. In an embodiment, the transistors 442 and 444 of the pulldown acceleration circuit 406 can both be NMOS transistors.

The transistor 434 of the pullup logic 430 includes a first current electrode coupled to a first supply voltage, Vdd, a second current electrode, and a control electrode coupled to the second terminal of the inverter 412. The pullup control transistor 432 includes a first current electrode coupled to the second current electrode of the transistor 434, a second current electrode coupled to the second terminal of the inverter 416, and a control electrode coupled to the first terminal of the inverter 410. The transistor 444 of the pulldown logic 440 includes a first current electrode coupled to a second supply voltage, Vss, a second current electrode, and a control electrode coupled to the first terminal of the inverter 412. The pulldown control transistor 442 includes a first current electrode coupled to the second current electrode of the transistor 444, a second current electrode coupled to the second terminal of the inverter 416, and a control electrode coupled to the first terminal of the inverter 410.

During operation of the electronic device 400, the logic value on each of the first and second input terminals of the logic circuit 402 control the logic value on the second terminal of the inverter 416. For example, the input logic values A and B, with the corresponding output logic value, Y, for the electronic device 400 can be seen in table 3 below:

TABLE 3

Truth Table for electronic device 400

| A | B | Y |
|---|---|---|
| 0 | 0 | 0 |
| 0 | 1 | 1 |
| 1 | 0 | 1 |
| 1 | 0 | 0 |

Thus, the output logic value can be represented as the following function:

$$Y = A*BN | AN*B \qquad \text{EQ. 2}$$

The function for the output logic value Y can be non-monotonic with respect to both input logic values A and B. Therefore, the path of a logic value transition through the logic circuit 402 can vary in speeds for different logic value transitions. In the example, of FIG. 4 the slowest transition paths through the electronic circuit 400 can be for A (1→0) and Y (0→1) with input state of B=1, and A (0→1) and Y (1→0) with input state of B=1. Thus, in previous logic circuits, the state change propagation through the logic circuit when the logic value transition is from A=1 to A=0 (which causes output logic value Y to transition from Y=0 to Y=1) is the slowest when input logic value B=1. Thus, the select input logic value, A, transitioning from 1→0 can cause the inverted logic value, AN, to transition from 0→1. Therefore, the pass gate 418 is turned off, and pass gate 420 is turned on, such that the inverted input logic value, BN=0, is provided to at to the first terminal of inverter 416, which in turn causes the output logic state, Y, of the logic circuit 402 to transition from 0→1. Similarly, in previous logic circuits, the state change propagation through the logic circuit when the logic value transition is from A=0 to A=1 (which causes output logic value Y to transition from Y=1 to Y=0) is the slowest when input logic value B=1. Thus, the select input logic value, A, transitioning from 0→1 can cause the inverted logic value, AN, to transition from 1→0. Therefore, the pass gate 420 is turned off, and pass gate 418 is turned on, such that the input logic value, B=1, is provided to the first terminal of inverter 416, which in turn cause the output logic state, Y, of the logic circuit 402 to transition from 1→0.

In this embodiment of electronic device 400, control electrode of the transistor 434 of pullup logic 430 is coupled to the second terminal of the inverter 412 to receive the inverted input logic value, BN, and the transistor 444 of pulldown logic 440 is coupled to the first terminal of the inverter 412 to receive the input logic value, B.

In this embodiment, the logic value of BN=0 being provided to the control electrode of transistor 434 can increase the speed that the pullup acceleration circuit 404 causes the output logic value Y to transition from 0→1 when the input logic value A transitions from 1→0 and input value B=1. Thus, the reception of the inverted logic state, BN, at the control electrode of transistor 434 can increase the logic state transition propagation through the electronic device 400 when the input logic value A transitions from 1→0 and input value B=1.

Similarly, in this embodiment, the logic value of B=1 being provided to the control electrode of transistor 444 can increase the speed that the pulldown acceleration circuit 406 causes the output logic value Y to transition from 1→0 when the input logic value A transitions from 0→1 and input value B=1. Thus, the reception of the logic state, B, at the control electrode of transistor 444 can increase the logic state transition propagation through the electronic device 400 when the input logic value A transitions from 0→1 and input value B=1.

Figure 5:
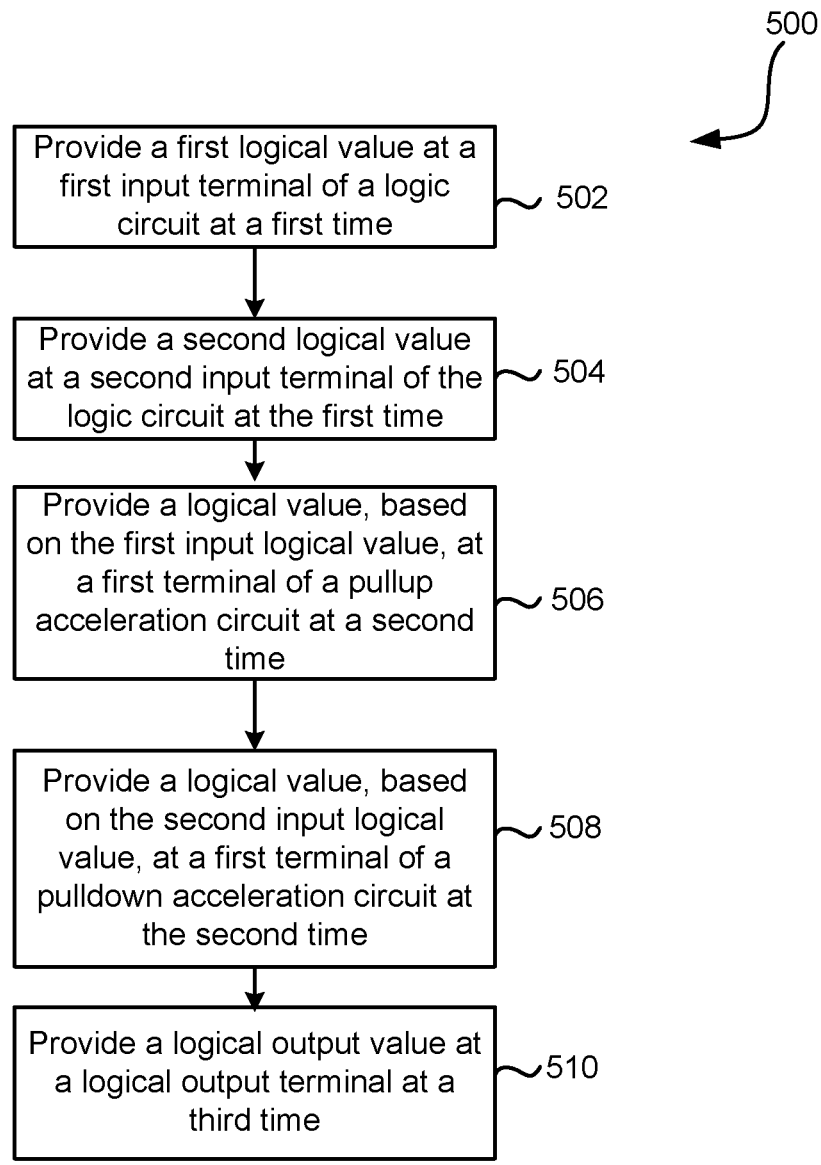
FIG. 5 illustrates a flow diagram of a method for accelerating a slow signal path within a logic circuit according to at least one embodiment of the present disclosure.

FIG. 5 illustrates a flow diagram of a method 500 for accelerating a slow signal path within a logic circuit according to at least one embodiment of the present disclosure. At block 502, a first logical value is received at a first input terminal of the logic circuit. A second logical value is received at a second input terminal of a logic circuit at block 504. In an embodiment, the first and second logical values can both be received at a first time.

At block 506, a logical value is provided to a first input terminal of a pullup acceleration circuit. In an embodiment, the logical value at the first input terminal is based on the first logical value at the first input terminal. A logical value is provided to a second input terminal of a pulldown acceleration circuit at block 508. In an embodiment, the logical value at the second input terminal is based on the second logical value. In an embodiment, the logical values provided to the pullup acceleration circuit and to the pulldown acceleration circuit can be provided at a second time. At block 510, a logical output value is provided at a logical output terminal. In an embodiment, the logical output value is provided at a third time that is after the second time.

According to an embodiment of the disclosure an electronic device includes a logic circuit, a pullup acceleration circuit, a first propagation path, and a second propagation path. In an embodiment, the logic circuit includes a first input terminal, a first inverter, a second inverter, a first switch, and an output terminal coupled to the second inverter. In an embodiment, the pullup acceleration circuit includes a pullup circuit and a pullup control transistor that are coupled in series in between a first supply voltage and the output terminal of the logic circuit. In an embodiment, the first signal propagation path propagates a logic value transition from the first input terminal to the output terminal within a first amount of time based on a transition at the first input terminal. In an embodiment, the first propagation path includes the first input terminal, the first inverter, the first switch, the second inverter, and the output terminal. In an embodiment, the second signal propagation path excludes the first switch, but includes the first input terminal, the first inverter, the pullup circuit, and the output terminal. In an embodiment, the second signal propagation path propagates the logic value transition from the first input terminal to the output terminal through the first inverter, the pullup circuit, and the pullup control transistor of the second signal propagation path within a second amount of time. In an embodiment, the second amount of time is shorter than the first amount of time in response to the logic circuit being non-monotonic with respect to the logic value.

In an embodiment, the electronic device further includes a pulldown acceleration circuit, which in turn includes a pulldown circuit and a pulldown control transistor that are coupled in series in between a second supply voltage and the output terminal of the logic circuit. In this embodiment, the electronic device also includes a third signal propagation path that includes a second input terminal, a third inverter, a second switch, the third inverter, and the output terminal. In this embodiment, the third signal propagation path propagates a logic value transition from the second input terminal to the output terminal through the second input terminal, the third inverter, the second switch, and the second inverter of the second signal propagation path within a third amount of time.

In this embodiment, the electronic device further includes a fourth signal propagation path including the second input terminal, the third inverter, the pulldown circuit, and the output terminal. In this embodiment, the fourth signal propagation path propagates the logic value transition from the second input terminal to the output terminal through the third inverter, the pulldown circuit, and the pulldown control transistor of the fourth signal propagation path within a fourth amount of time. In this embodiment, the fourth amount of time is shorter than the third amount of time in response to the logic circuit being non-monotonic with respect to the logic value. In this embodiment, the second switch and the second inverter within the fourth signal propagation path cause the third amount of time to be longer than the fourth amount of time. In another embodiment, the first switch and the second inverter within the first signal propagation path cause the first amount of time to be longer than the second amount of time.

According to an embodiment of the disclosure an electronic device includes a logic circuit and a pullup acceleration circuit. The logic circuit includes multiple logical input terminals, a logical output terminal, a first inverter, a first switch, and a second inverter. In an embodiment, logical input terminals include a first logical input terminal and a second logical input terminal. In an embodiment, the logical output terminal provides an output logical value based on a combination of logic values at the first and second input terminals. In an embodiment, the first inverter includes a first terminal coupled to the first logical input terminal, and a second terminal to provide a first inverted logic value of a first logic value at the first logical input terminal. In an embodiment, the first switch includes a first terminal coupled to the second terminal of the first inverter, and a second terminal to provide the first inverted logic value received at the first terminal of the first switch in response to a first control signal. In an embodiment, the second inverter includes a first terminal coupled to the second terminal of the first switch, and a second terminal coupled to the logical output terminal. In an embodiment, the second inverter provides the output logical value to the logical output terminal based on the first inverted logic value provided by the first switch in response to the first control signal.

In an embodiment, the pullup acceleration circuit includes a pullup circuit and a pullup control transistor. The pullup circuit includes a first terminal coupled to the second terminal of the first inverter. In an embodiment, the pullup circuit and the pullup control transistor are coupled in series in between a first supply voltage and the output of the logic circuit. In an embodiment, the pullup acceleration circuit provides a logic value transition from zero to one in a shorter amount of time than a first signal path through the first inverter, the first switch, and the second inverter in response to the logic circuit being non-monotonic with respect to a logic value at the second input terminal.

In an embodiment, the pullup circuit includes a third terminal coupled to first supply voltage. In another embodiment, the first signal path is a slowest signal path in the logic circuit in response to the logic circuit being non-monotonic with respect to the logic value at the second input terminal when the first logic value is a particular logic value. In another embodiment, the logic circuit further includes a third inverter and a second switch. In this embodiment, the third inverter includes a first terminal coupled to a third logical input terminal, and a second terminal to provide a second inverted logic value of a second logic value at the third logical input terminal. In this embodiment, the second switch includes a first terminal coupled to the second terminal of the third inverter, and a second terminal coupled to the second inverter to provide the second inverted logic value received at the first terminal of the second switch in response to an inverted first control signal. In this embodiment, the second switch provides the output logical value to the logical output terminal based on the second inverted logic value provided by the second switch in response to the inverted first control signal.

In an embodiment, the logic circuit further includes a pulldown acceleration circuit, which in turn includes a pulldown circuit and a pulldown control transistor. In an embodiment, the pulldown circuit includes a first terminal coupled to the second terminal of the third inverter. In an embodiment, the pulldown circuit and the pulldown control transistor are coupled in series in between a second supply voltage and the output terminal of the logic circuit. In an embodiment, the pulldown acceleration circuit provides a logic value transition from one to zero in a shorter amount of time than a second signal path through the third inverter, the second switch, and the second inverter in response to the logic circuit being non-monotonic with respect to the logic value at the second input terminal.

In this embodiment, the pulldown circuit includes a third terminal coupled to a ground voltage source. In another embodiment, the second signal path is a slowest signal path in the logic circuit in response to the logic circuit being non-monotonic with respect to the logic value at the second input terminal when the third logic value is a particular logic value. In an embodiment, the logic circuit is a multiplexor.

According to an embodiment of the disclosure a method includes receiving, at a first time, a first logical value at a first input terminal of a logic circuit. The method further includes providing, at a second time, a logical value at a first input terminal of a pullup acceleration circuit. In an embodiment, the logical value at the first input terminal of the pullup acceleration circuit is based on the first logical value. The method also includes providing, at a third time, a logical output value at a logical output terminal via the pullup acceleration circuit prior to the logical output value being provided via the logic circuit. In an embodiment, the third time is after the second time.

In an embodiment, the logical output value is provided at the logical output terminal via the pullup acceleration circuit prior to the logical output value being provided via the logic circuit in response to the logic circuit being non-monotonic with respect to the first logical value. In another embodiment, the logical value at the first input terminal of the pullup acceleration circuit is an inverted logical value of the first logical value. In an embodiment, the method further includes receiving, at the first time, a second logical value at a second input terminal of the logic circuit. The method also includes providing, at the second time, a logical value at a first input terminal of a pulldown acceleration circuit. In an embodiment, the logical value at the first input terminal of the pulldown acceleration circuit is based on the second logical value. The method also includes providing, at a third time, the logical output value at the logical output terminal via the pulldown acceleration circuit prior to the logical output value being provided via the logic circuit. In an embodiment, the third time is after the second time.

In an embodiment, the logical output value is provided at the logical output terminal via the pulldown acceleration circuit prior to the logical output value being provided via the logic circuit in response to the logic circuit being non-monotonic with respect to the second logical value. In an embodiment, the logical value at the first input terminal of the pulldown acceleration circuit is an inverted logical value of the second logical value.

The preceding description in combination with the Figures was provided to assist in understanding the teachings disclosed herein. The discussion focused on specific implementations and embodiments of the teachings. This focus was provided to assist in describing the teachings, and should not be interpreted as a limitation on the scope or applicability of the teachings. However, other teachings can certainly be used in this application. The teachings can also be used in other applications, and with several different types of architectures.

In this document, relational terms such as "first" and "second", and the like, may be used solely to distinguish one entity or action from another entity or action without necessarily requiring or implying any actual such relationship or order between such entities or actions. The terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. An electronic device comprising:
  a logic circuit including a first input terminal, a first inverter, a second inverter, a first switch, and an output terminal coupled to the second inverter;
  a pullup acceleration circuit including a pullup circuit and a pullup control transistor, the pullup circuit and the pullup control transistor are coupled in series in between a first supply voltage and the output terminal of the logic circuit;
  a first signal propagation path to propagate a logic value transition from the first input terminal to the output terminal within a first amount of time based on a transition at the first input terminal, the first propagation path including the first input terminal, the first inverter, the first switch, the second inverter, and the output terminal; and
  a second signal propagation path, that excludes the first switch, including the first input terminal, the first inverter, the pullup circuit, and the output terminal, the second signal propagation path to propagate the logic value transition from the first input terminal to the output terminal through the first inverter, the pullup circuit, and the pullup control transistor of the second signal propagation path within a second amount of time, wherein the second amount of time is shorter than the first amount of time in response to the logic circuit being non-monotonic with respect to the logic value.

2. The electronic device of claim 1, further comprising:
  a pulldown acceleration circuit including a pulldown circuit and a pulldown control transistor, the pulldown circuit and the pulldown control transistor are coupled in series in between a second supply voltage and the output terminal of the logic circuit.

3. The electronic device of claim 2, further comprising:
  a third signal propagation path including a second input terminal, a third inverter, a second switch, the third inverter, and the output terminal, the third signal propagation path to propagate a logic value transition from the second input terminal to the output terminal through the second input terminal, the third inverter, the second switch, and the second inverter of the second signal propagation path within a third amount of time.

4. The electronic device of claim 3, further comprising:
a fourth signal propagation path including the second input terminal, the third inverter, the pulldown circuit, and the output terminal, the fourth signal propagation path to propagate the logic value transition from the second input terminal to the output terminal through the third inverter, the pulldown circuit, and the pulldown control transistor of the fourth signal propagation path within a fourth amount of time, wherein the fourth amount of time is shorter than the third amount of time in response to the logic circuit being non-monotonic with respect to the logic value.

5. The electronic device of claim 4, wherein the second switch and the second inverter within the fourth signal propagation path causes the third amount of time to be longer than the fourth amount of time.

6. The electronic device of claim 1, wherein the first switch and the second inverter within the first signal propagation path causes the first amount of time to be longer than the second amount of time.

7. An electronic device comprising:
a logic circuit comprising:
 a plurality of logical input terminals, including a first logical input terminal and a second logical input terminal;
 a logical output terminal to provide an output logical value based on a combination of logic values at the first and second input terminals;
 a first inverter including a first terminal coupled to the first logical input terminal, and a second terminal to provide a first inverted logic value of a first logic value at the first logical input terminal;
 a first switch including a first terminal coupled to the second terminal of the first inverter, and a second terminal to provide the first inverted logic value received at the first terminal of the first switch in response to a first control signal;
 a second inverter including a first terminal coupled to the second terminal of the first switch, and a second terminal coupled to the logical output terminal, the second inverter to provide the output logical value to the logical output terminal based on the first inverted logic value provided by the first switch in response to the first control signal; and
a pullup acceleration circuit including:
 a pullup circuit including a first terminal coupled to the second terminal of the first inverter;
 a pullup control transistor coupled to the pullup circuit, the pullup circuit and the pullup control transistor are coupled in series in between a first supply voltage and the output of the logic circuit, wherein the pullup acceleration circuit provides a logic value transition from zero to one in a shorter amount of time than a first signal path through the first inverter, the first switch, and the second inverter in response to the logic circuit being non-monotonic with respect to a logic value at the second input terminal.

8. The electronic device of claim 7, the pullup circuit including a third terminal coupled to first supply voltage.

9. The electronic device of claim 7, wherein the first signal path is a slowest signal path in the logic circuit in response to the logic circuit being non-monotonic with respect to the logic value at the second input terminal when the first logic value is a particular logic value.

10. The electronic device of claim 7, the logic circuit further comprising:
a third inverter including a first terminal coupled to a third logical input terminal, and a second terminal to provide a second inverted logic value of a second logic value at the third logical input terminal; and
a second switch including a first terminal coupled to the second terminal of the third inverter, and a second terminal coupled to the second inverter to provide the second inverted logic value received at the first terminal of the second switch in response to an inverted first control signal, the second switch to provide the output logical value to the logical output terminal based on the second inverted logic value provided by the second switch in response to the inverted first control signal.

11. The electronic device of claim 10, the logic circuit further comprising:
a pulldown acceleration circuit including:
 a pulldown circuit including a first terminal coupled to the second terminal of the third inverter;
 a pulldown control transistor coupled to the pulldown circuit, the pulldown circuit and the pulldown control transistor are coupled in series in between a second supply voltage and the output terminal of the logic circuit, wherein the pulldown acceleration circuit provides a logic value transition from one to zero in a shorter amount of time than a second signal path through the third inverter, the second switch, and the second inverter in response to the logic circuit being non-monotonic with respect to the logic value at the second input terminal.

12. The electronic device of claim 11, the pulldown circuit including a third terminal coupled to a ground voltage source.

13. The electronic device of claim 11, wherein the second signal path is a slowest signal path in the logic circuit in response to the logic circuit being non-monotonic with respect to the logic value at the second input terminal when the third logic value is a particular logic value.

14. The electronic device of claim 7, wherein the logic circuit is a multiplexor.

15. A method comprising:
receiving, at a first time, a first input logical value at a first input terminal of a logic circuit;
receiving, at the first time, a second input logical value at a second input terminal of the logic circuit;
providing, at a second time, a first control logical value at a first input terminal of a pullup acceleration circuit, wherein the first control logical value at the first input terminal of the pullup acceleration circuit is based on the first input logical value;
providing, at the second time, a second control logical value at a first input terminal of a pulldown acceleration circuit, wherein the second control logical value at the first input terminal of the pulldown acceleration circuit is based on the second input logical value; and
providing, at a third time, a logical output value at a logical output terminal via the pullup acceleration circuit or the pulldown acceleration circuit prior to the logical output value being provided via the logic circuit, wherein the third time is after the second time.

16. The method of claim 15, wherein the logical output value is provided at the logical output terminal via the pullup acceleration circuit prior to the logical output value being provided via the logic circuit in response to the logic circuit being non-monotonic with respect to the first logical value.

17. The method of claim 15, wherein the logical value at the first input terminal of the pullup acceleration circuit is an inverted logical value of the first logical value.

18. The method of claim 15, wherein the logical output value is provided at the logical output terminal via the pulldown acceleration circuit prior to the logical output value being provided via the logic circuit in response to the logic circuit being non-monotonic with respect to the second logical value.

19. The method of claim 15, wherein the logical value at the first input terminal of the pulldown acceleration circuit is an inverted logical value of the second logical value.

* * * * *